United States Patent

[11] 3,609,258

[72] Inventor Gerald H. Leland
Dayton, Ohio

[21] Appl. No. 861,579
[22] Filed Sept. 29, 1969
[45] Patented Sept. 28, 1971
[73] Assignee Ledex, Inc.
Dayton, Ohio

[54] ELECTRIC SWITCH AND PRINTED CIRCUIT BOARD CONSTRUCTION WITH IMPROVED TERMINAL CONNECTION MEANS
11 Claims, 3 Drawing Figs.

[52] U.S. Cl. ........................................................ 200/11 D, 200/166 CT, 200/168 S, 317/101 D
[51] Int. Cl. ........................................................ H01h 19/58, H01h 9/02
[50] Field of Search ........................................... 200/11 D, 14, 166 MS, 168 S, 166 CT; 317/101 C, 101 D, 101 DH, 101, 101 R

[56] References Cited

UNITED STATES PATENTS

| | | | |
|---|---|---|---|
| 3,525,824 | 8/1970 | Von Fange et al. | 200/11 D |
| 3,525,827 | 8/1970 | Allison | 200/11 D |
| 3,069,598 | 12/1962 | Daily et al. | 317/101 D |
| 3,205,319 | 9/1965 | Anderson et al. | 200/166 CT |
| 3,283,060 | 11/1966 | Wiese | 317/101 C X |
| 3,454,736 | 7/1969 | Bogl | 200/168 S |
| 3,504,313 | 3/1970 | Jans | 200/11 D X |

*Primary Examiner*—J. R. Scott
*Attorney*—Dybvig & Dybvig

ABSTRACT: Two sets of printed circuit terminal lugs are used with a wafer switch. The terminal lugs connected to the wafer switch at points closest to the printed circuit board have a generally planar configuration. Each of the other lugs has an intermediate portion projecting away from the wafer switch whereby all of the possible switch positions on the wafer switch can be connected by a terminal lug to a printed circuit board without electrical contact between the lugs or other switch parts.

PATENTED SEP 28 1971

3,609,258

INVENTOR.
GERALD H. LELAND

BY [signature]

HIS ATTORNEYS

ELECTRIC SWITCH AND PRINTED CIRCUIT BOARD CONSTRUCTION WITH IMPROVED TERMINAL CONNECTION MEANS

This invention relates to a switch and printed circuit board construction and more particularly to a terminal lug construction for mechanically and electrically connecting a wafer switch to a printed circuit board.

A typical wafer switch construction includes a ring-shaped stator having a plurality of circumferentially spaced switch contacts. Wafer switches of this type are provided with various types of terminal lugs such as lugs for soldering or welding and lugs for connection to printed circuit boards. In most cases the terminal lugs project in generally radial directions from the center axis of the stator. When used in a circuit carried by a printed circuit board, the stator is normally oriented in a plane perpendicular to the board and the terminal lugs are parallel to a face of the stator. Accordingly, only about half of the stator switch contacts, those nearest the printed circuit board, can ordinarily be connected into the circuit. If additional switch connections are required by the circuit, it has been the practice either to use additional wafer switches or to use two printed circuit boards.

An object of this invention is to make it possible for any or all of the stator switch contacts of a wafer switch to be electrically and mechanically connected to a single printed circuit board. As a result, the switch assembly can be simplified because it is unnecessary to add additional wafer switches or to use more than a single printed circuit board.

This object is accomplished by the provision of two types or sets of printed circuit terminal lugs, the lugs of one set projecting, as in the past, in a straight line between the stator switch contacts and the printed circuit board and the lugs of the other set following a nonlinear path, each lug of the second set having an intermediate portion projecting away from the adjacent face of the stator thereby to avoid electrical contact with any of the terminal lugs of the first set or with any of the other wafer switch parts.

Other objects and advantages will become apparent from the following description and the drawing in which:

FIG. 1 is a side elevational view of a portion of an electric circuit assembly including a wafer switch construction and a printed circuit board, parts of which have been omitted or broken away to simplify the disclosure. In FIG. 1, circuit elements attached to the printed circuit board are only schematically illustrated, it being understood that the details of the electric circuit are unimportant to this invention.

Figures 1, 2, 3:
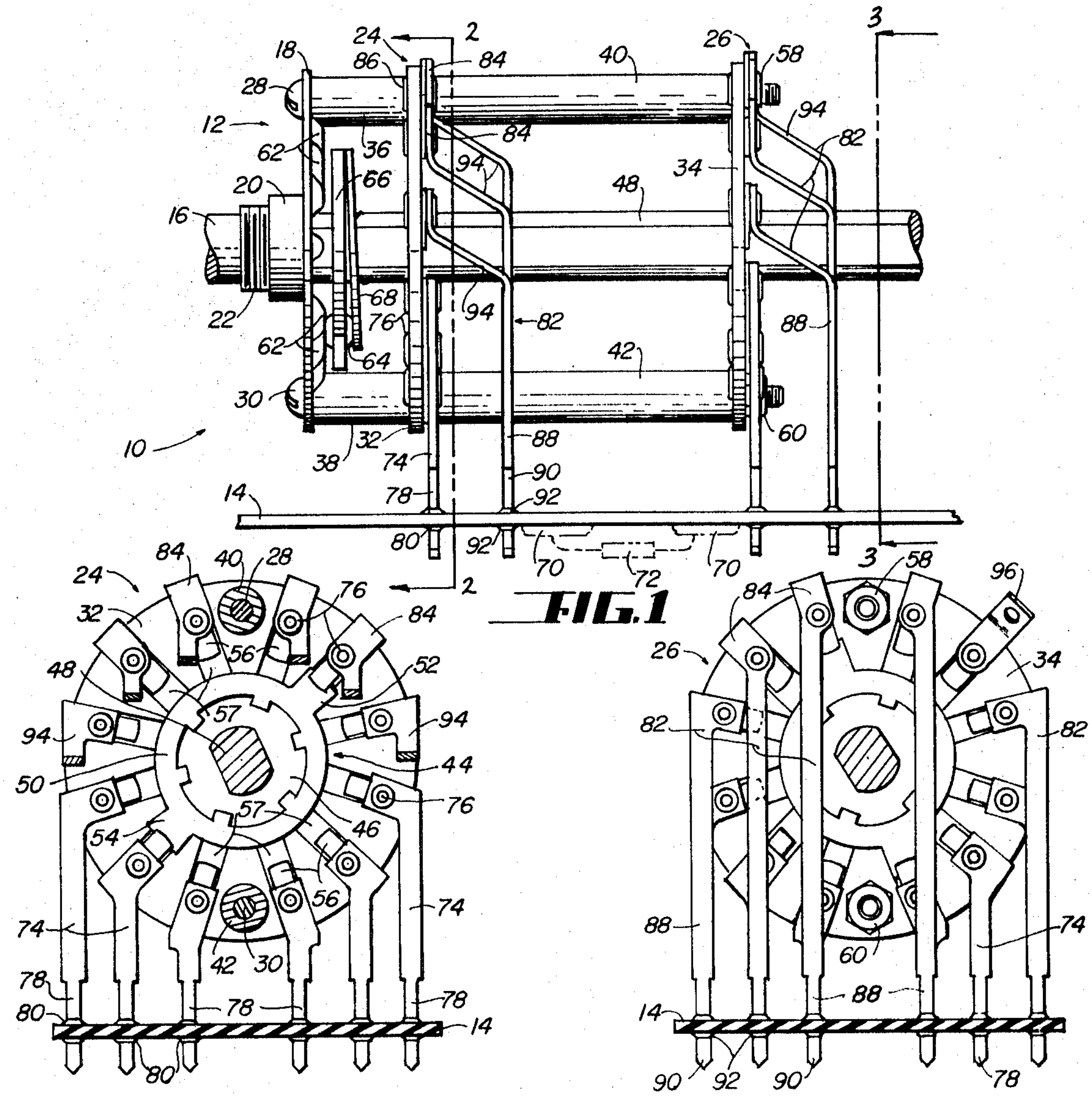
FIG. 2 is a cross-sectional view of the electric circuit assembly of FIG. 1 as viewed in the direction of arrows 2—2 thereof.
FIG. 3 is a cross-sectional view of the electric circuit assembly of FIG. 1 as viewed in the direction of arrows 3—3 thereof.

Referring to the drawing in greater detail, an electric circuit assembly, generally designated 10, is illustrated therein including a wafer switch assembly 12 and a printed circuit board 14.

The wafer switch assembly 12 includes a switch shaft 16 rotatable about its longitudinal axis which is parallel to the printed circuit board 14. A frame plate 18 is mounted upon the shaft 16 by a bushing 20 which may be threaded as indicated at 22 for mounting onto a fixed cabinet plate or the like (not shown). The frame plate 18 does not rotate with the switch shaft 16 and serves as part of a mounting for wafer switches of which two, generally designated by reference characters 24 and 26, are illustrated herein. The mounting further includes a pair of mutually parallel struts 28 and 30 which are parallel to the switch shaft 16 and which pass through diametrically opposed apertures in the frame plate 18 and through aligned apertures in ring-shaped stators of insulating material, designated 32 and 34, forming parts of the wafer switches 24 and 26, respectively. The wafer switch assembly 24 is separated from the frame plate 18 by tubular spacers 36 and 38, received on the struts 28 and 30, respectively. Similar tubular spacers 40 and 42 separate the wafer switch 26 from the wafer switch 24.

Referring to FIGS. 1 and 2, the wafer switch assembly 24, in addition to its ring-shaped stator 32, includes a circular, disc-shaped rotor 44 having a body 46 of insulating material, the center of which has a "double-D" aperture for receiving a "-double-D"-shaped section 48 of the switch shaft 16. Mounted on one face of the rotor body 46 is an annular conductor 50 having radially outwardly projecting rotor switch contacts 52 and 54, which, when the switch shaft 16 is rotated, wipe against different ones of a plurality of radially oriented and circumferentially spaced stator switch contacts 56 mounted on one face of the stator 32. The stator switch contacts 56 may be of any suitable construction such as a piece of spring metal bent to form a clip, the free ends of which are separated by the rotor switch contacts 52 and 54 whereupon good electrical contact therebetween is ensured Radial slots 57 may be cut in the inner surface of the stator 32 to provide added space for the stator switch contacts 56.

With reference to FIGS. 1 and 3, the wafer switch 26 is illustrated as identically constructed to the wafer switch 24 as thus far described. When the switch assembly 12 is assembled, the rotors of the wafer switches 24 and 26 are inserted upon the "-double-D" section 48 of the switch shaft 16 and nuts 58 and 60, respectively, are threaded on the struts 28 and 30 whereupon the wafer switches 24 and 26 are held in fixed relation to the frame plate 18. In operation the switch shaft 16 is normally driven through predetermined angles whereupon the rotor switch contacts are indexed from one stator switch position to the next. Shown on the left-hand side of FIG. 1 is an index or detent mechanism including a plurality of radially disposed ribs 62 on the face of the frame plate 18 confronting the wafer switch 24 which are adapted to receive therebetween a ball detent 64 trapped in a detent plate 66 between the frame plate 18 and a detent spring 68. As well known the ribs 62 are appropriately spaced so that the switch shaft 16 will rotate through the proper angles required on each actuation of the switch shaft 16. The details of construction of the detent mechanism as well as the manner in which the frame plate 18 is held fixed relative to the shaft 16 are unimportant to this invention and, hence are not illustrated or described in detail herein. Suffice to state that the constructional details of the switch assembly 12 as thus far described may be entirely conventional.

The printed circuit board 14 is also of conventional construction, the board 14 comprising an insulating plate upon which conductors such as those schematically illustrated at 70 may be formed and carrying circuit elements such as the resistor 72. The electric circuits to be controlled by the switch assembly 12 will depend upon the application for which the circuit is intended and the circuit, per se, forms no part of this invention.

As shown in FIGS. 2 and 3, one half of the stator switch positions are located below an imaginary plane parallel to the printed circuit board 14 containing the longitudinal axis of the switch shaft 16 and hence, bisecting the stators 32 and 34. The remaining one half of the stator switch positions are all above the same imaginary plane. In accordance with this invention all of the stator switch positions can be connected by an array of printed circuit terminal lugs to the printed circuit board 14. To accomplish this result a first set of printed circuit terminal lugs, each designated 74, are connected to the stator switch contacts 56 which are closer to the printed circuit board 14 than the aforementioned imaginary plane containing the longitudinal axis of the switch shaft 16. Each of the first set of printed circuit terminal lugs 74 has a first end connected to one of the stator switch contacts 56 as by a hollow rivet 76. The hollow rivets 76 also serve to mount the stator switch contacts 56 on the stator 32. The ends of the terminal lugs 74 terminate in terminal points 78 which project through apertures in the printed circuit board 14 and are electrically and mechanically connected thereto as by solder as indicated at 80. As conventional in past constructions, the first set of terminal lugs 74 may comprise planar strips of conductive metal which, by virtue of their mounting to the face of the stator 32, are substantially coplanar therewith. The first set of terminal lugs 74 may be identical to those commonly in use. Because each terminal lug 74 is connected to the stator 32 at a different switch position, the construction of each is slightly different as well understood by those skilled in the art.

The array of terminal lugs in accordance with this invention further includes a second set of terminal lugs, designated 82, each having a first end 84 connected to the stator 32 by a hollow rivet 86 at a stator switch position which is located further from the printed circuit board 14 than the aforementioned imaginary plane. Each of the terminal lugs 82 further includes a second end portion 88 terminating in a terminal point 90 that also projects through an aperture in the printed circuit board 14 and is soldered thereto as indicated at 92. The second end portions 88 are shown substantially parallel to but spaced from the first set of terminals 74, the spacing being in a direction parallel to the length of the shaft 16. This spacing is accomplished by bending the terminals 82 whereupon an intermediate portion thereof, designated 94, projects in a direction generally parallel to the shaft 16 away from the adjacent face of the stator 32, the intermediate portions 94 sloping downwardly from their point of connection to the stator switch contacts 56 toward the printed circuit board 14. As a result there is no danger of accidental electrical contact between the second set of terminal lugs 82 either with the first set of terminal lugs 74 or other switch parts associated therewith.

As apparent from the drawing, there are differences among the second set of terminal lugs 82 because of the different switch positions to which they are to be connected. For convenience in mounting the printed circuit board 14, the free ends of both sets of terminal lugs 74 and 82 are coplanar. To reach all of the switch positions, the various terminal lugs have different lengths as well as slightly different shapes.

The particular wafer switch 24 illustrated in FIG. 2 has 12 stator switch positions. The longitudinal axes of the struts 28 and 30 are located in a common plane perpendicular to the printed circuit board 14 which also bisects the switch stator 24. Hence, half of the 12 switch positions are on one side of the plane of the struts 28 and 30 and the other half on the other side of the same plane. Preferably, the longer terminal lugs 82 follow essentially a straight line path, as viewed in the direction of the switch shaft 16, from their point of connection to the stator to the printed circuit board 14. The illustrated locations of the struts 28 and 30 are thus preferred in order to simplify the construction of the terminal lugs 82.

The 12 stator switch positions are shown occupied by stator contacts 56 and terminal lugs 74 or 82 for the purpose of demonstrating that all switch positions on one side of the stator 24 can be utilized. Those skilled in the art are aware that only very rarely, if ever, would all of the switch positions be connected to a printed circuit. More typically, two or three of the switch positions would be used and only so many terminals 74 and 82 would be mounted on the stator 24 and connected to the printed circuit board 14 as are required to connect a switch contact 56 with a circuit contact on the printed circuit board 14. In practice the rotor body 46 would often have annular conductors on both faces and the stator switch contacts would be located on both faces of the stator 32. With such a construction some of the terminal lugs 74 and 82 would be mounted on the opposite faces of the wafer switches from that illustrated. As well known one of the stator switch contacts 56 may be located or constructed to continuously engage the annular rotor conductor 50 for supplying power to the switch construction. Also, the annular rotor conductor 50 may have only one or more than two radially outwardly directed switch contacts such as those designated 52 and 54. Any of these rotor switch contacts may, depending upon the use to which they are put, extend through an arc greater than that illustrated.

The terminal lugs associated with the wafer switch 26 are identical to those illustrated in connection with the wafer switch 24 and hence are given the same reference characters. In FIG. 3, the desired parallel relationship between the portions 88 of the terminal lugs 82 is illustrated. It will also be observed that these portions of the terminal lugs 82 are parallel to the corresponding portions of the terminal lugs 74 when viewed in the length direction of the switch shaft 16. It can be appreciated that, as a result of this invention, printed circuit boards can be provided with parallel rows of apertures for receiving the terminal points, the apertures in the rows being at a standard spacing.

FIG. 3 also illustrates a solder terminal lug 96 of conventional design which is located at one of the stator switch positions in place of one of the printed circuit terminal lugs 82. Of course it will be understood that various other types of terminal lugs could be used in association with the terminal lugs 74 and 82 illustrated.

Having thus described my invention, I claim:

1. In an electric circuit assembly of the type having a wafer switch on a switch shaft, a printed circuit board, said shaft lying in an imaginary plane generally parallel to said printed circuit board, and means electrically and mechanically connecting said printed circuit board to said wafer switch, the improvement wherein said means includes at least one terminal lug having an intermediate portion projecting outwardly from a face of said wafer switch and generally in a direction parallel to the length direction of said switch shaft.

2. The improvement of claim 1 wherein said means further includes at least one terminal lug projecting in a substantially straight line from said wafer switch to said printed circuit board.

3. An electric circuit assembly including a printed circuit board having electric circuit elements thereon and a plurality of apertures therethrough opening to electric contact points on said circuit board and electrically connected by printed circuit conductors on said board to said circuit elements, a switch assembly including frame means, a switch stator fixed in relation to said frame means, a switch shaft lying in an imaginary plane parallel to said printed circuit board and substantially bisecting said stator, a switch rotor on said shaft and rotatable therewith, and an array of printed circuit terminal lugs fixed to said stator, each having terminal points projecting through said apertures and in electrical contact with said contact points, said array of printed circuit terminal lugs including at least one terminal lug having a first end portion affixed to said stator, a second end portion including its terminal point located in a plane substantially parallel to and spaced from a face of said stator, and an intermediate portion extending generally in a direction parallel to said shaft.

4. The apparatus of claim 3 wherein said first end portion of said terminal lug is connected to said stator at an area of said stator which is further from said printed circuit board than is said imaginary plane.

5. The apparatus of claim 3 wherein said array of terminal lugs includes a first set of terminal lugs affixed to said stator at points lying entirely between said imaginary plane and said printed circuit board, each of said first set of terminal lugs being of substantially planar configuration and located closely adjacent the plane of said face of said stator throughout their entire length, and a second set of terminal lugs each of which includes an intermediate portion projecting generally in a direction parallel to said shaft, each said second set of terminal lugs being connected to said stator at areas spaced further from said printed circuit board than any portion of said first set of terminal lugs.

6. The apparatus of claim 3 wherein said stator is connected to said frame by a pair of parallel struts the longitudinal axes of which lie in a common plane perpendicular to said imaginary plane and bisecting said stator.

7. In a wafer switch assembly of the type including a ring-shaped stator mounted in a fixed position upon a switch shaft and having a rotor driven by said switch shaft, the stator having a plurality of circumferentially spaced stator contacts adapted to be engaged by a conductor on said rotor, said stator being mounted upon said switch shaft by mounting means including a pair of struts, the improvement wherein said stator contacts are adapted to be electrically connected to contacts on a single printed circuit board disposed generally parallel to a plane in which said shaft lies by printed circuit terminal lugs affixed to said board and to said stator, at least one of said terminal lugs having an intermediate portion extending from said stator generally in a direction parallel to said switch shaft thereby to avoid contact with any part of said wafer switch other than its associated stator contact.

8. In a wafer switch assembly of the type including a ring-shaped stator mounted in fixed position upon a switch shaft and having a rotor driven by said switch shaft, the stator having a plurality of circumferentially spaced stator contacts adapted to be engaged by a conductor on said rotor, said stator being mounted upon said switch shaft by mounting means including a pair of struts, the improvement wherein said stator contacts are adapted to be electrically connected to contacts on a single printed circuit board by printed circuit terminal lugs affixed thereto and to said stator, each of said lugs having terminal points for mechanical and electrical connection to a printed circuit board, the terminal points of some of said printed circuit terminal lugs being spaced further from said stator in the longitudinal direction of said shaft than the terminal points of others of said printed circuit terminal lugs.

9. The improvement of claim 8 wherein the free ends of said terminal points are mutually coplanar and wherein said terminal points of each of said printed circuit terminal lugs connected to said stator beneath an imaginary plane containing the longitudinal axis of said shaft and parallel to the plane of said free ends of said terminal points are located closer to said stator than said terminal points of each of said printed circuit terminal lugs affixed to said stator above said imaginary plane.

10. The improvement of claim 9 wherein each of said printed circuit terminal lugs which are affixed to said stator beneath said imaginary plane are substantially straight and wherein each of the others of said printed circuit terminal lugs are bent with an intermediate portion thereof projecting outwardly from said face of said stator generally in the direction of the length of said shaft.

11. The improvement of claim 10 wherein said struts are mutually parallel and parallel to said shaft, one of said struts being above said imaginary plane and the other of said struts being located below said imaginary plane.